Figure 1A:
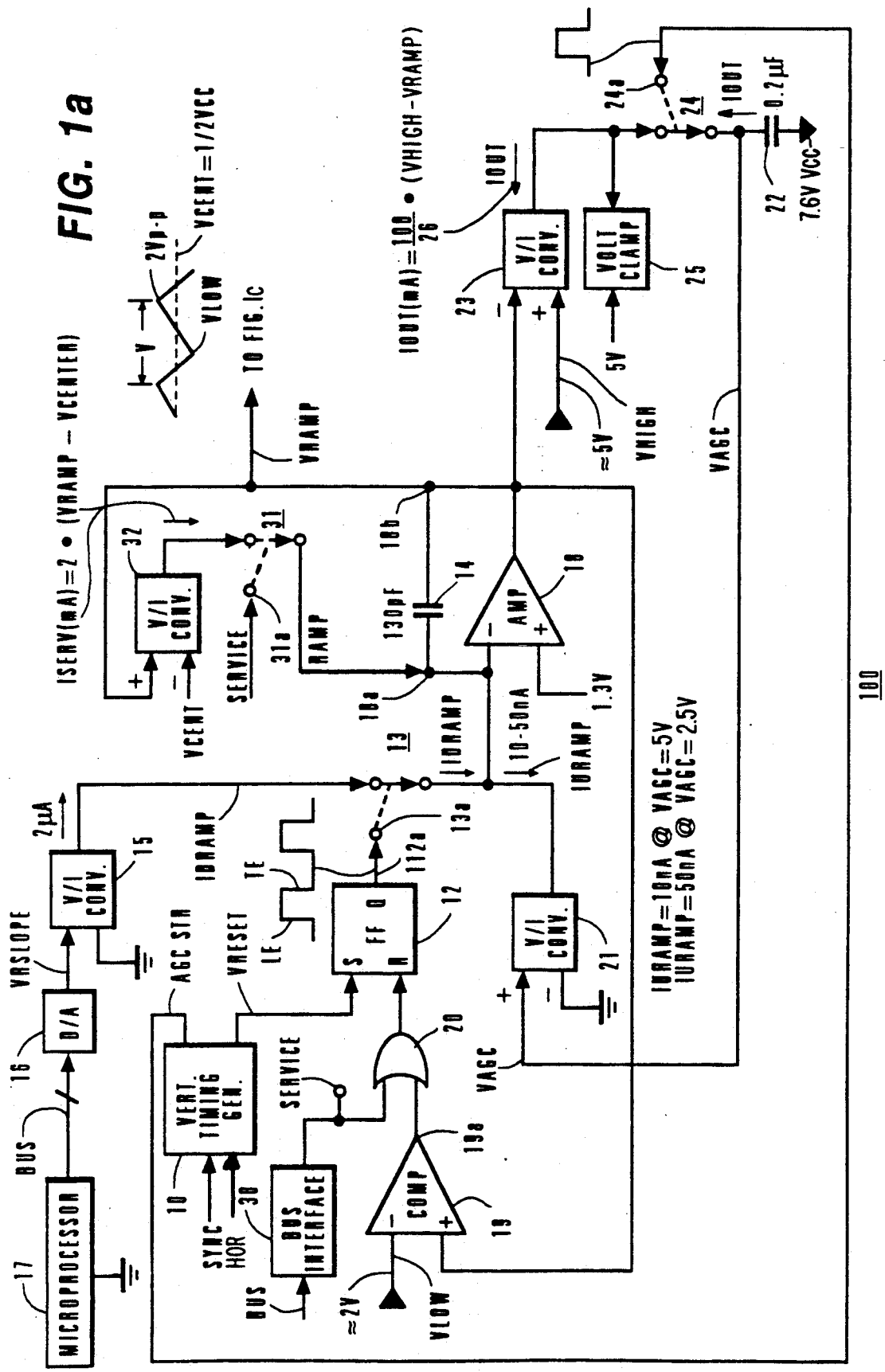

United States Patent [19]

Rodriguez-Cavazos

[11] Patent Number: 5,216,336
[45] Date of Patent: Jun. 1, 1993

[54] GENERATOR FOR SAWTOOTH SIGNAL WITH SELECTABLE RETRACE SLOPE FOR A DEFLECTION APPARATUS

[75] Inventor: Enrique Rodriguez-Cavazos, Indianapolis, Ind.

[73] Assignee: Thomson Consumer Electronics, Inc., Indianapolis, Ind.

[21] Appl. No.: 843,075

[22] Filed: Mar. 2, 1992

[51] Int. Cl.⁵ .................. G09G 1/04; H01J 29/52; H01J 29/70
[52] U.S. Cl. .................. 315/387; 315/399; 315/384
[58] Field of Search .............. 315/387, 389, 384, 408, 315/399, 364, 403

[56] References Cited

U.S. PATENT DOCUMENTS 3,944,883 3/1976 Henley et al. .................. 315/399

OTHER PUBLICATIONS

Yamamoto et al., "A New Video Processor for Color TV", 1988 IEEE Pub.
An article entitled A New Video Processor for Color TV in the names of Yamamoto et al., dated 1988 and publ. by IEEE.
Appl. Ser. No. 843,074, filed Mar. 2, 1992 in the names of Wilber et al. and entitled Resistor-Matched Deflection Apparatus for a Video Display.
Appl. Ser. No. 843,063, filed Mar. 2, 1992 in the name of K. R. Koblitz and entitled A Deflection Circuit Having a Controllable Sawtooth Generator.
Appl. Ser No. 843,062, filed Mar. 2, 1992 in the names of Koblitz et al. and entitled Service Switch for Video Display Deflection Apparatus.
Appl. Ser. No. 843,061, filed Mar. 2, 1992 in the names of Koblitz et al. and entitled Service Adjustment Arrangement for a Sawtooth Generator of a Video Display.

Primary Examiner—Gregory C. Issing
Attorney, Agent, or Firm—Joseph S. Tripoli; Joseph J. Laks; Sammy S. Henig

[57] ABSTRACT

The length of the retrace portion of a vertical sawtooth signal is controlled by a microprocessor. In this way, the same type of an integrated circuit that includes the sawtooth generator can be used for generating the sawtooth signal required either for a switch or a non-switch vertical deflection circuit output stage.

4 Claims, 4 Drawing Sheets

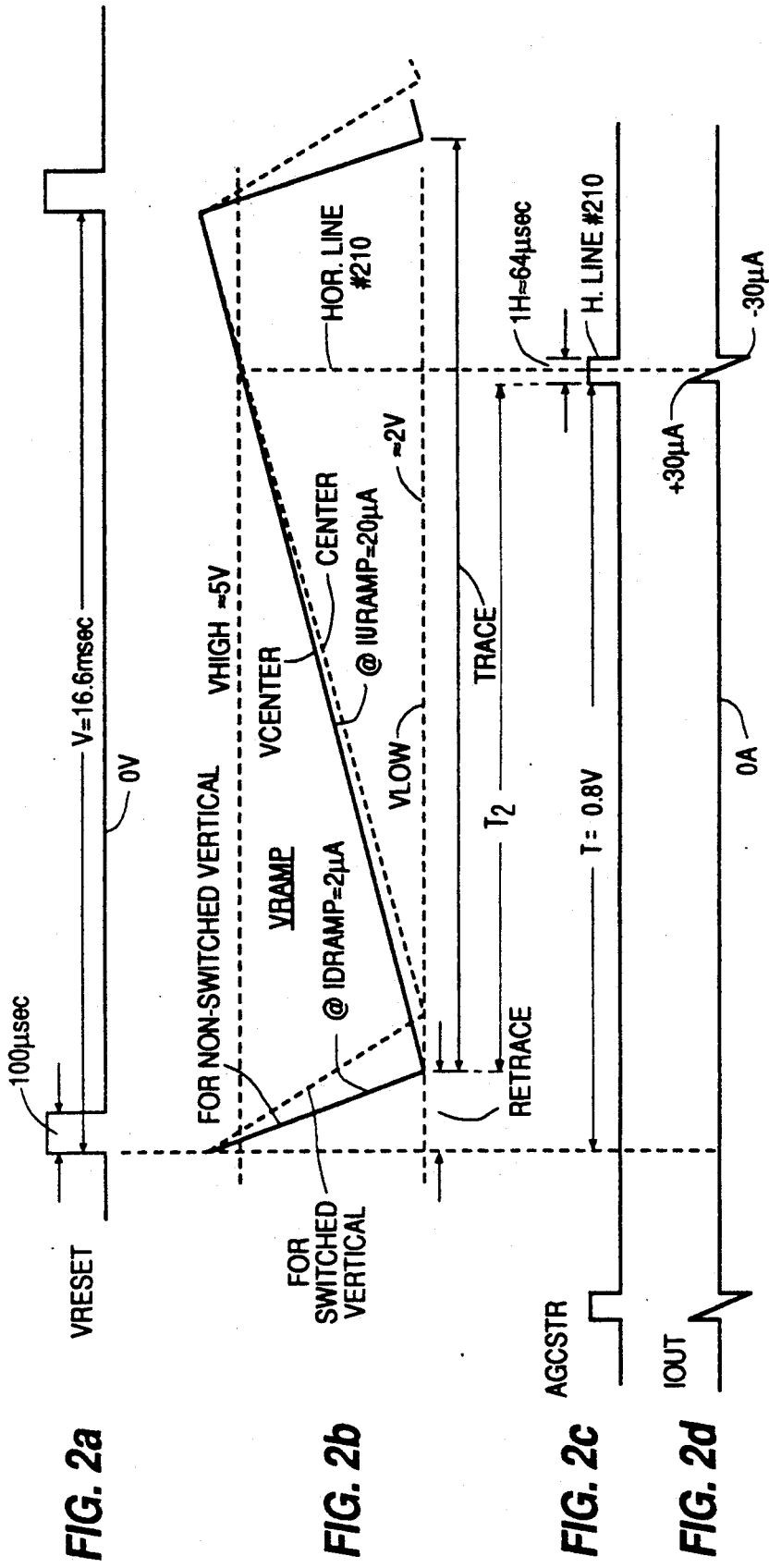

GENERATOR FOR SAWTOOTH SIGNAL WITH SELECTABLE RETRACE SLOPE FOR A DEFLECTION APPARATUS

The invention relates to a sawtooth generator of a deflection arrangement in a video apparatus.

Typically, a vertical sawtooth generator of a vertical deflection circuit in a television receiver utilizes a current integrating capacitor that is charged from a source of a D.C. current to produce a ramp, trace portion of an output sawtooth signal synchronized to a vertical synchronizing signal. The trace portion of the sawtooth signal controls a trace portion of a vertical deflection current that produces vertical deflection in a cathode ray tube (CRT).

To produce the deflection current, the sawtooth signal is coupled to a vertical deflection circuit output stage. One typical output stage is of the switch vertical type, such as described in, for example, U.S. Pat. No. 4,737,691, in the names of den Hollander et al., entitled "TELEVISION APPARATUS FOR GENERATING A PHASE MODULATED DEFLECTION CURRENT". Another typical output stage is of the non-switched type, such as described in, for example, U.S. Pat. No. 4,686,432 entitled "VERTICAL DEFLECTION CIRCUIT FOR ELECTRON BEAMS IN PICTURE TUBE", in the names of Berland et al.

The sawtooth generator may be implemented in an integrated circuit (IC). It may be desirable to utilize the same type of IC for generating a sawtooth signal to drive either a switch vertical deflection circuit output stage or a non-switched vertical deflection circuit output stage. This feature provides a greater flexibility in the range of usages of the I.C. However, a longer retrace ramp portion of the sawtooth signal may be required when switched than when nonswitched vertical deflection circuit output stage is driven by the sawtooth signal. Therefore, it may be desirable to control the length of the retrace ramp portion of the sawtooth signal under a control of a microprocessor that may control other functions in the I.C.

In a video display deflection apparatus, embodying an aspect of the invention, a sawtooth signal at a frequency that is related to a deflection frequency having a trace portion and a retrace portion is generated. A data signal containing information that is indicative of a length of the retrace portions is generated. A digital-to-analog converter responsive to the data signal generates a control signal for controlling, in accordance with the data signal, the length of the retrace portion. A deflection circuit output stage is responsive to the sawtooth signal for generating a deflection current in the deflection winding having a retrace portion that is determined in accordance with the data signal to form a raster on a screen of the cathode ray tube.

Figure 1B:
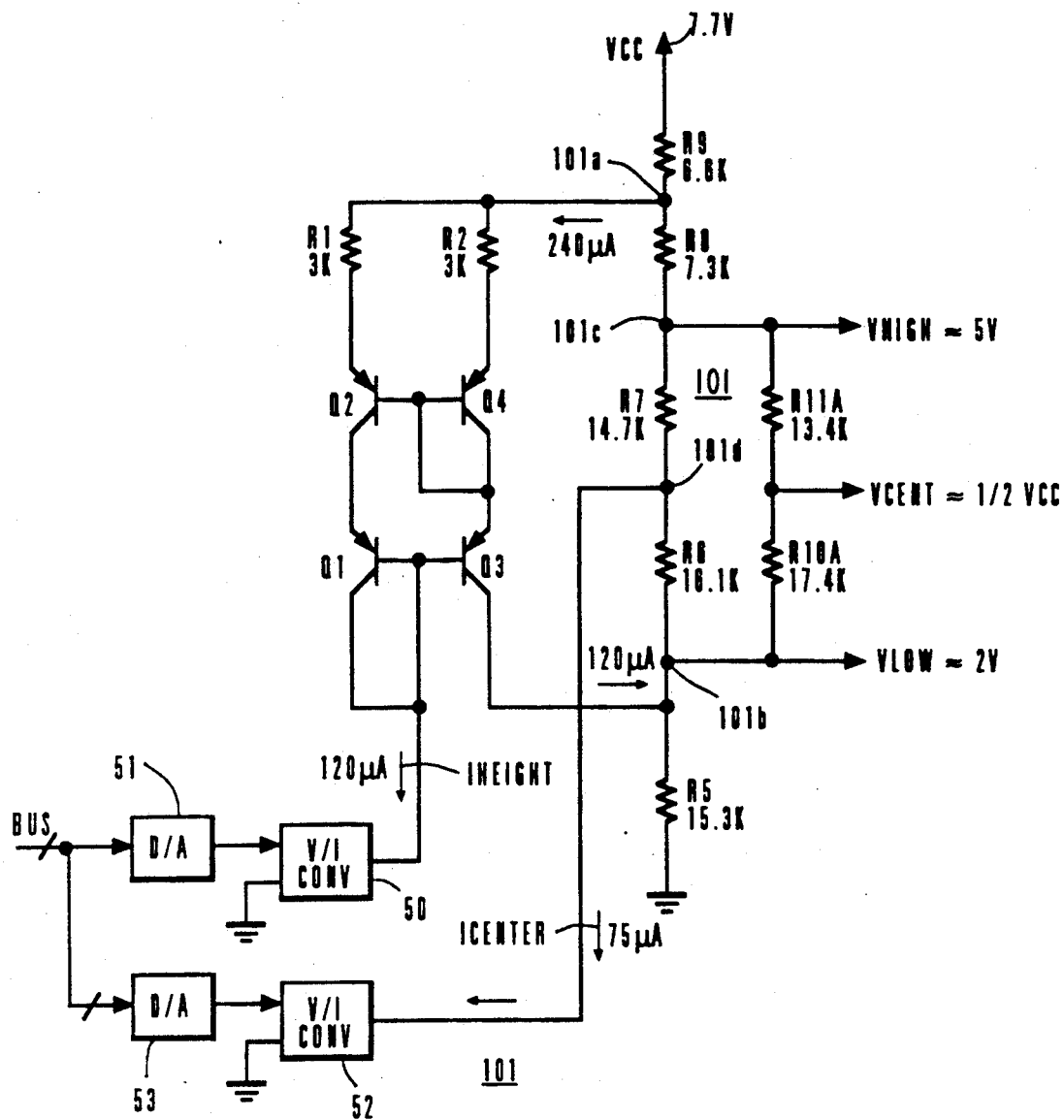
Figure 1C:
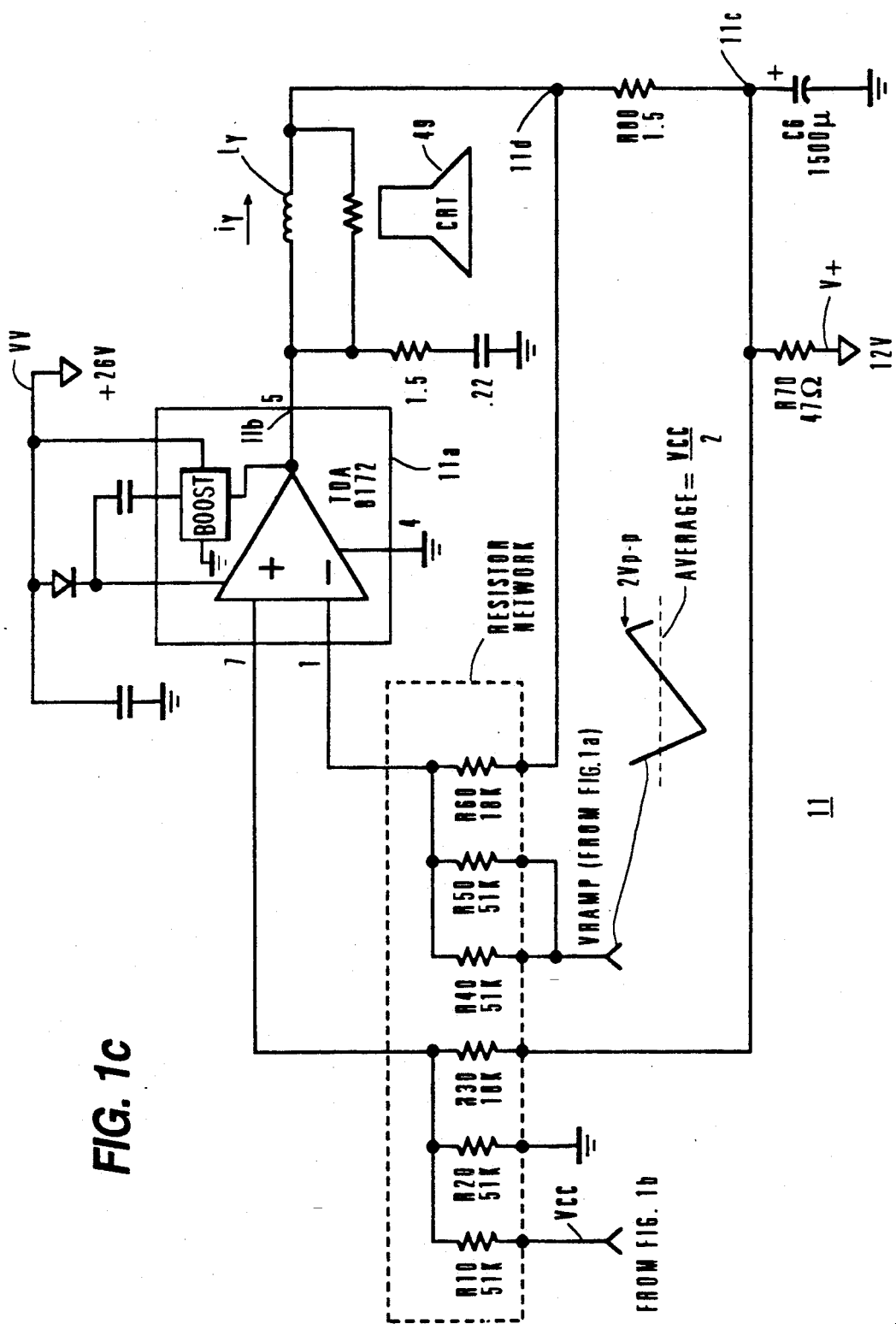

FIGS. 1a, 1b and 1c illustrate, a vertical deflection circuit, embodying an aspect of the invention; and FIGS. 2a–2d illustrate idealized waveforms of the arrangement of FIG. 1.

FIGS. 1a, 1b and 1c illustrate, partially in block diagram form, a vertical deflection circuit, embodying an aspect of the invention that includes a sawtooth generator 100. A synchronizing signal SYNC produced by, for example, a video detector of a television receiver, not shown, that processes a television signal conforming to the NTSC standard, for example, is coupled to a vertical timing generator 10. Generator 10 generates a vertical rate pulse signal VRESET, as shown in FIG. 2a. Similar symbols and numerals in FIGS. 1a, 1b, 1c and 2a–2d indicate similar items or functions.

Pulse signal VRESET of FIG. 1a is coupled to a "set" input of a Set-Reset flip-flop 12 causing flip-flop 12 to change states. Consequently, an output Q of flip-flop 12 produces a leading edge LE of an output control signal 112a. Leading edges of signals VRESET and 112a occur at the end of a given vertical trace interval and initiate vertical retrace. Signal 112a is coupled to a control terminal 13a of a current switch 13. Immediately after leading edge LE, signal 112a causes switch 13 to couple a D.C. current IDRAMP to a junction terminal 18a of an integrating capacitor 14 that is fabricated using an integrating circuit (IC) fabrication technique.

Current IDRAMP is produced in a voltage-to-current (V/I) converter 15 that is controlled by a voltage VRSLOPE produced in a digital-to-analog (D/A) converter 16. The digital data input to D/A converter 16 is supplied via a bus BUS from a microprocessor 17. Microprocessor 17 may additionally control various adjustment functions, not shown, in the television receiver such as S-shaping and East-West correction. A second end terminal 18b of integrating capacitor 14 is coupled to an output of an amplifier 18 where a sawtooth signal VRAMP is generated. Current IDRAMP forms a retrace portion RETRACE of sawtooth signal VRAMP of FIG. 2b. Terminal 18a of capacitor 14 of FIG. 1a is coupled to an inverting input terminal of amplifier 18 to form a current integrator.

Signal VRAMP of FIG. 1a is also coupled to a noninverting input terminal of a comparator 19 that senses the level of signal VRAMP during portion RETRACE to determine an end time of portion RETRACE of signal VRAMP. An inverting input terminal of comparator 19 is coupled to a source of a D.C. reference voltage VLOW that is generated in a manner discussed later on. An output terminal 19a of comparator 19 is coupled via an "OR" gate 20 to a "reset" input R of flip-flop 12.

When, as a result of current IDRAMP, signal VRAMP ramps down and attains a level that is equal to voltage VLOW, comparator 19 produces an output signal that causes flip-flop 12 to change states and to produce, at output Q, a trailing edge TE of signal 112a. Thereafter, current IDRAMP is decoupled from capacitor 14 by switch 13.

In accordance with an aspect of the invention, a magnitude of current IDRAMP is programmable, in accordance with the value of the digital data input to D/A converter 16 for providing the required retrace slope or length of portion RETRACE of signal VRAMP. For example, in an arrangement similar to that of FIG. 1a, intended for controlling a switched vertical deflection circuit, not shown, V/I converter 15 may be programmed to produce current IDRAMP of a smaller magnitude than in FIG. 1a. In this way, portion RETRACE is lengthened, as shown in broken line in FIG. 2b, relative to the length of portion RETRACE used for controlling a non-switched vertical deflection circuit such as shown in FIG. 1c. Thus, retrace portion RETRACE of signal VRAMP of FIG. 2b can be made adaptable for operation with either a switched or non-switched vertical deflection circuit.

Provided that the pulse width of signal VRESET of FIG. 1a is shorter than the length of portion RETRACE of signal VRAMP, the precise timings of the trailing edge of signal VRESET is, advantageously, not critical. The advantage of not being critical is that timing generator 10 that is required for processing both nonstandard and standard sync signal SYNC can be simplified. Nonstandard sync signal SYNC might be received from, for example, a video tape recorder operating in a freeze-frame or still picture mode.

A D.C. current IURAMP that is substantially smaller than current IDRAMP is produced in a V/I converter 21. After trailing edge TE of signal 112a, current IURAMP that is coupled to terminal 18a of capacitor 14 charges capacitor 14 to produce a ramping trace portion TRACE of sawtooth signal VRAMP of FIG. 2b. The magnitude of current IURAMP of V/I converter 21 of FIG. 1a is controlled in an automatic gain control (AGC) feedback loop by a voltage VAGC, developed across a capacitor 22. Voltage VAGC controls converter 21 such that the more positive is voltage VAGC, the smaller is current IURAMP. An AGC strobe signal AGCSTR is coupled to a control terminal 24a of a switch 24.

Signal AGCSTR is produced in vertical timings generator 10 close to the end of vertical trace. Signal AGCSTR has a pulse width that is equal to the length of, for example, a horizontal video line or 64 microseconds. During the occurrence of the pulse of signal AGCSTR, a current IOUT, generated in a V/I converter 23, is couple via a switch 24 to capacitor 22. Outside of the occurence of the pulse of signal AGCSTR, capacitor 22 maintains its voltage approximately at a constant level to provide sample-and-hold operation. The magnitude of current IOUT is controlled in converter 23 is proportional to a difference between signal VRAMP and a reference voltage VHIGH, that is produced in a manner described later on.

During a given trace interval, should the magnitude of signal VRAMP be smaller than voltage VHIGH when strobe signal AGCSTR occurs, current IOUT would be positive and at a magnitude that is proportional to the difference between voltage VHIGH and signal VRAMP. Positive current IOUT causes a decrease of voltage VAGC in capacitor 22. Consequently, in subsequent vertical trace intervals, current IURAMP would be larger and the rate of increase of signal VRAMP would be greater than before in a manner to compensate for the aforementioned tendency of signal VRAMP to be smaller than required.

Conversely, should the magnitude of signal VRAMP be larger than voltage VHIGH, when the pulse of signal AGCSTR occurs, current IURAMP, in the subsequent vertical trace intervals, would be smaller. Thus, the AGC feedback loop causes the magnitude of signal VRAMP to be at the same level of voltage VHIGH, when strobe signal AGCSTR occurs. In steady state operation, the polarity of current IOUT changes at the center of the pulse of signal AGCSTR, as shown in FIG. 2d.

Immediately after the circuit is energized, capacitor 22 is fully discharged. Capacitor 22 is coupled to voltage VCC. Therefore, upon power turn-on, voltage VAGC is equal to voltage VCC and the amplitude of ramp signal VRAMP is at a minimum or zero. Had capacitor 22 been coupled to ground, instead, the amplitude of signal VRAMP at power turn-on might have been excessive. Excessive amplitude of signal VRAMP could cause excessive deflection current amplitude. The result could be that the electron beam in CRT 49 could impinge on a neck of CRT 49 and damage CRT 49.

Signal AGCSTR is made to occur further from the center of vertical trace portion TRACE and as close to the end of vertical trace as feasible. In this way, the length of an interval between the instant when the level of signal VRAMP is established to be equal to voltage VLOW and the instant when signal AGCSTR is generated is, for example, at the maximum feasible length. The upper limit as to how late in the cycle of signal VRAMP, signal AGCSTR can occur, is determined by the minimum required length of the vertical cycle of signal VRAMP. Illustratively, signal AGCSTR is selected to occur after an interval T, having a length of 80% of the nominal vertical period V, has elapsed from the trailing edge TE of signal 112a, as shown in FIG. 2c.

A time CENTER occurs at the center of portion TRACE. At a time that is further away from time CENTER of FIG. 2b, the level of signal VRAMP is close to its peak value. Therefore, the relative contribution of offset errors to control accuracy is reduced with respect to a situation in which signal AGCSTR occurs, for example, at time CENTER. It follows that, advantageously, a more accurate control of signal VRAMP of FIG. 1a can be obtained.

Signal VRAMP is waveform corrected for providing S-shaping, in a manner not shown, and D.C. coupled to, for example, a D.C. coupled linear vertical deflection circuit 11 of FIG. 1c that includes a vertical amplifier 11a for producing a vertical deflection current iy in a vertical deflection winding Ly. Winding Ly of FIG. 1c provides vertical deflection in a CRT 49. Advantageously, D.C. coupling eliminates the need for a large A.C. coupling capacitor and eliminates a dependency of linearity and S-correction on the coupling capacitor characteristics.

FIG. 1b illustrates an arrangement 101, for generating voltages VHIGH, and VLOW of FIG. 1a, referred to before, and for generating a voltage VCENT that is used for vertical centering adjustment purposes, as explained later on. Arrangement 101 includes a resistor R9 having a terminal that is coupled to a supply voltage VCC of 7.7 volts. A second terminal, 101a, of resistor R9 is coupled to a resistor R8. A terminal 101c of resistor R8 is coupled to a series arrangement of resistors R7 and R6. The series arrangement of resistors R7 and R6 is coupled between terminal 101c and a terminal 101b. A resistor R5 is coupled between terminal 101b and ground. A second series arrangement of resistors R11A and R10A is coupled between terminals 101b and 101c, in parallel with the series arrangement of resistors R7 and R6.

Voltage VLOW is developed at terminal 101b. Voltage VHIGH is developed at terminal 101c. Voltage VCENT is developed at a terminal 101d, between resistors R11A and R10A.

A V/I converter 52 that is controlled by input data received via bus BUS from microprocessor 17 of FIG. 1a and via a D/A converter 53 produces a D.C. current ICENTER of FIG. 1b. Current ICENTER is coupled between resistors R6 and R7. Current ICENTER provides adjustment of the average value of signal VRAMP by adjusting voltages VLOW and VHIGH so as to adjust vertical centering. The average value of signal VRAMP is nominally equal to one-half the value of voltage VCC. Because signal VRAMP is D.C. coupled to winding Ly of FIG. 1c, a change in the average value of signal VRAMP causes a corresponding change in the vertical centering of the electron beam.

A V/I converter 50 of FIG. 1b that is controlled by input data received via bus BUS from microprocessor 17 of FIG. 1a and via a D/A converter 51 of FIG. 1b produces a D.C. current IHEIGHT of FIG. 1b that is coupled both to the base and to the collector of a transistor Q1, coupled in a diode configuration. The base and collectors of transistor Q1 are coupled to the base of a transistor Q3 to control a collector current in transistor Q3 that is equal to current IHEIGHT. The collector of transistor Q3 is coupled to terminal 101b between resistors R5 and R6. Collector base electrodes of a transistor Q4 are coupled together in a diode configuration and also coupled to the emitter of transistor Q3 for supplying the current of transistor Q3. The emitter of transistor Q4 is coupled via a resistor R2 to terminal 101a. The base of transistor Q2 is coupled to the base and to the collector of transistor Q4. The emitter of transistor Q2 is coupled via a resistor R1 to terminal 101a. A collector of transistor Q2 is coupled to the emitter of transistor Q1 for supplying the collector current of transistor Q1.

Transistors Q1, Q2, Q3 and Q4 form a temperature compensated current mirror arrangement. The sum of the emitter currents of transistors Q2 and Q4 that flow in resistors R1 and R2, respectively, is supplied via terminal 101a and is equal to twice the value of current IHEIGHT. Whereas, the collector current of transistor Q3, that is coupled to terminal 101b, is equal to current IHEIGHT.

The level of current IHEIGHT is controlled to establish the required peak-to-peak amplitude of signal VRAMP of FIG. 1a by establishing the levels of voltages VHIGH and VLOW. An adjustment of current IHEIGHT causes voltages VHIGH and VLOW to change in opposite directions.

A change in current IHEIGHT produces a change in the peak-to-peak amplitude of signal VRAMP for providing vertical height adjustment without affecting vertical centering. For example, an increase in current IHEIGHT of FIG. 1b causes voltages VHIGH to decrease and voltage VLOW to increase such that the average value of voltage VRAMP and the level of voltage VCENT remain unaffected by the increase in current IHEIGHT. This advantageous feature is obtained by selecting the appropriate values for the resistors in arrangement 101 as well as for the currents that are coupled to terminals 101a and 101b and produced by transistors Q1, Q2, Q3 and Q4.

The level of current ICENTER is controlled via bus BUS such that voltages VLOW and VHIGH change in the same direction. For example, an increase in current ICENTER, made for service raster centering adjustment, causes each of voltages VHIGH and VLOW to decrease.

The values of the resistors in arrangement 101 are also selected in such a way that the peak-to-peak amplitude of signal VRAMP of FIG. 1a remains approximately the same after adjustment of current ICENTER of FIG. 1b. Therefore, adjustment of vertical centering does not affect vertical height. Advantageously, the peak-to-peak amplitude of signal VRAMP and the average value of signal VRAMP can be adjusted independently of each other.

In deflection circuit 11 of FIG. 1c, deflection winding Ly is coupled in series with a deflection current sampling resistor R80 to form a series arrangement that is coupled between an output terminal 11b of amplifier 11a and a junction terminal 11c of a power supply decoupling capacitor Cb. A resistor R70 couples to terminal 11c a supply voltage V+ of, for example, +12 volts. A junction terminal 11d, coupled between winding Ly and resistor R80, is coupled via a feedback resistor R60 to an inverting input terminal of amplifier 11a. Terminal 11c of resistor R80 is coupled via a resistor R30 to a noninverting input terminal of amplifier 11a. In this way, a negative feedback voltage that is developed across resistor R80 is applied to the input terminals of amplifier 11a. Sawtooth signal VRAMP that controls amplifier 11a is coupled via a parallel arrangement of resistors R40 and R50 to the inverting input terminal of amplifier 11a. Voltage VCC is coupled via a resistor R10 to the noninverting input terminal of amplifier 11a. A resistor R20 is coupled between the noninverting input terminal of amplifier 11a and ground.

Resistors R10, R20, R30, R40, R50 and R60 are manufactured, for example, on a common substrate to form a single resistor network package for providing close temperature tracking. Each of resistors R10, R20, R30, R40, R50 and R60 has a tolerance of, for example, 0.5%. Resistors R10, R20 and R30 form a first portion of the resistor network for coupling voltage VCC and the voltage that is developed at terminal 11c to the noninverting input terminal of amplifier 11a. Resistors R40, R50 and R60 form a second portion of the resistor network for coupling signal VRAMP and the deflection current indicative feedback signal at terminal 11d to the inverting input terminal of amplifier 11d.

The values of the elements of arrangement 101 of FIG. 1b are selected in such a way that the average value of signal VRAMP of FIG. 1c is nominally equal to one-half of voltage VCC. Assume that the voltages at terminals 11d and 11c are equal when the level of signal VRAMP is equal to one-half of voltage VCC. Thus, the Thevenin equivalent, with respect to the inverting input terminal of amplifier 11a, of the portion of the circuit that includes signal VRAMP and resistors R40, R50 and R60, is equal to the Thevenin equivalent, with respect to the noninverting input terminal of amplifier 11a, of the portion of the circuit that includes voltage VCC and resistors R10, R20 and R30. Therefore, signal VRAMP that is equal to its average value or one-half of voltage VCC, produces deflection current iy that is nominally zero or close to zero. Signal VRAMP produces current iy having approximately symmetrical negative and positive peak amplitudes.

The contribution of each of resistors R10, R20 and R30 to the Thevenin equivalent, with respect to the noninverting input terminal of amplifier 11a, is the same as the contribution of each of resistors R40, R50 and R60, respectively, to the Thevenin equivalent with respect to the inverting input terminal. This is so, because the resistors within a given pair of each of the pairs (R10, R40), (R20, R50) and (R30, R60) are of equal values. Advantageously, because the resistors within each of the pairs are of equal value, a closer or better match and temperature tracking is obtained than if the resistor of such pair were of unequal value. Such close temperature tracking occurs because, in the manufacture process, it is more feasible to make a pair of separate resistors having close temperature tracking coefficient, such as 50 ppm/°C., when they are of equal value. By establishing the average value of signal VRAMP equal to one-half of voltage VCC, the pair of resistors R10 and R40 could be made of equal value resistors and also the pair of resistors R20 and R50 could be made of equal value resistors.

Advantageously, because the resistors in each of the pairs are equal, common mode rejection with respect to a vertical rate parabolic voltage developed at terminal 11c of a capacitor C6 due to current iy, common mode rejection with respect to variations of supply voltage V+ and common mode rejection with respect to variations of supply voltage VCC are higher and less temperature dependent. Thus, distortion and D.C. current drift in deflection current iy are, advantageously, reduced, within an entire operational temperature range of, for example, 0° C. and 40° C. A change in voltage VCC due to, for example, a temperature change, causes both the average value of signal VRAMP, that is coupled to the inverting input terminal of amplifier 11a, and the portion of D.C. voltage VCC, that is coupled to the noninverting input terminal of amplifier 11a, to vary in the same direction and approximately by the same amounts. Therefore, advantageously, D.C. centering is made less dependent on variation of voltage VCC.

For the purpose of television receiver field adjustment or factory adjustment, it may be desirable to collapse the vertical raster and to establish the electron beam in CRT 49 of FIG. 1c at or close to the vertical center of the display screen.

A signal SERVICE of FIG. 1a that is produced in a bus interface unit 30 from input data generated by microprocessor 17 is coupled via "OR" gate 20 to "reset" input R of flip-flop 12, during service mode operation. Consequently, current IDRAMP is decoupled from capacitor 14. Instead, signal SERVICE that is coupled to a control terminal 31a of a switch 31, causes switch 31 to couple a current ISERV produced in a V/I converter 32 to terminal 18a of capacitor 14. V/I converter 32 generates current ISERV at a magnitude that is proportional to a difference between signal VRAMP and D.C. voltage VCENT produced in a manner that was described before. As a result of the negative feedback via V/I converter 32, signal VRAMP is established at a constant level that is equal to voltage VCENT, when signal SERVICE is generated. Signal VRAMP at the level of voltage VCENT produces a small or zero D.C. current iy of FIG. 1c that causes the vertical raster to collapse at the vertical center of the screen of CRT 49. Thus, horizontal scanning produced by a horizontal deflection circuit, not shown, occurs continuously at a vertical center of the display screen of CRT 49.

What is claimed is:

1. A video display deflection apparatus, comprising:
   means for generating a sawtooth signal at a frequency that is related to a deflection frequency having a trace portion and a retrace portion such that from a beginning time to an end time of said retrace portion said sawtooth signal varies in an opposite direction with respect to said trace portion;
   means for generating a control signal that is indicative of one of a length and a slope of said retrace portion;
   means responsive to said control signal and coupled to said sawtooth signal generating means for selectively controlling, in accordance with said control signal, said one of said length and slope of said retrace portion;
   a cathode ray tube;
   a deflection winding mounted on a neck of said cathode ray tube; and
   a deflection circuit output stage responsive to said sawtooth signal for generating a deflection current in said deflection winding having a retrace portion that is determined in accordance with said control signal to form a raster on a screen of said cathode ray tube.

2. An apparatus according to claim 1 wherein said control signal generating means comprises a microprocessor.

3. An apparatus according to claim 1 wherein said deflection winding comprises a vertical deflection winding.

4. An apparatus according to claim 1 wherein said sawtooth generator comprises a capacitor, a source of a first current responsive to said control signal and coupled to said capacitor for generating said sawtooth signal in said capacitor, and wherein a magnitude of said first current determines a rate of change of a voltage in said capacitor, during said retrace portion.

* * * * *